(12) United States Patent
Arnold

(10) Patent No.: US 9,330,943 B2
(45) Date of Patent: May 3, 2016

(54) LOW COST REPACKAGING OF THINNED INTEGRATED DEVICES

(71) Applicant: Apple Inc., Cupertino, CA (US)

(72) Inventor: Shawn X. Arnold, San Jose, CA (US)

(73) Assignee: Apple Inc., Cupertino, CA (US)

( * ) Notice: Subject to any disclaimer, the term of this patent is extended or adjusted under 35 U.S.C. 154(b) by 237 days.

(21) Appl. No.: 13/902,727

(22) Filed: May 24, 2013

(65) Prior Publication Data

US 2014/0159214 A1 Jun. 12, 2014

Related U.S. Application Data

(60) Provisional application No. 61/736,514, filed on Dec. 12, 2012.

(51) Int. Cl.
| | |
|---|---|
| H05K 1/00 | (2006.01) |
| H01L 21/52 | (2006.01) |
| H01L 23/00 | (2006.01) |
| H05K 1/18 | (2006.01) |
| H01L 21/48 | (2006.01) |
| H05K 1/02 | (2006.01) |
| H01L 23/538 | (2006.01) |
| H01L 23/24 | (2006.01) |
| H05K 3/00 | (2006.01) |
| H05K 3/46 | (2006.01) |

(52) U.S. Cl.
CPC ............. H01L 21/52 (2013.01); H01L 24/00 (2013.01); H05K 1/185 (2013.01); *H01L 21/4803* (2013.01); *H01L 23/24* (2013.01); *H01L 23/5389* (2013.01); *H01L 23/562* (2013.01); *H01L 2924/12042* (2013.01); *H05K 1/0271* (2013.01); *H05K 3/0035* (2013.01); *H05K 3/4652* (2013.01); *H05K 2203/1469* (2013.01)

(58) Field of Classification Search
CPC ...................................................... H01L 21/52
See application file for complete search history.

(56) References Cited

U.S. PATENT DOCUMENTS

| | | | |
|---|---|---|---|
| 5,324,687 | A | 6/1994 | Wojnarowski |
| 7,075,180 | B2 | 7/2006 | Narendra et al. |
| 8,102,041 | B2 | 1/2012 | Lin |
| 8,119,497 | B2 | 2/2012 | Forman et al. |
| 2006/0068523 | A1* | 3/2006 | Lin ............................... 438/109 |
| 2008/0309581 | A1 | 12/2008 | Fujii et al. |
| 2013/0032390 | A1* | 2/2013 | Hu et al. ....................... 174/266 |

* cited by examiner

*Primary Examiner* — William Harriston
(74) *Attorney, Agent, or Firm* — Downey Brand LLP

(57) ABSTRACT

A method for mounting and embedding a thinned integrated circuit within a substrate is provided. In one embodiment, the thinned integrated circuit can receive one or more biasing substrate layers on a first surface of the thinned integrated circuit. When the thinned integrated circuit is embedded within a supporting substrate, such as a printed circuit board, the biasing substrate layers can position the thinned integrated circuit toward a centerline of the printed circuit board. Positioning the thinned integrated circuit toward the centerline can increase the resistance to breakage.

14 Claims, 4 Drawing Sheets

LOW COST REPACKAGING OF THINNED INTEGRATED DEVICES

CROSS REFERENCE TO RELATED APPLICATIONS

This application claims the benefit of U.S. Provisional Application No. 61/736,514, filed Dec. 12, 2012 and entitled "LOW COST REPACKAGING OF THINNED INTEGRATED DEVICES" which is incorporated by reference herein in its entirety for all purposes.

FIELD OF THE DESCRIBED EMBODIMENTS

The described embodiments relate generally to thinned integrated circuit devices and more particularly to repackaging of the thinned integrated circuit devices.

BACKGROUND

Integrated circuits are typically formed on silicon wafers and oftentimes packaged within a plastic or ceramic body with electrical contacts distributed on the outside of the body to couple power and signals to and from the integrated circuit. The body can protect the fragile integrated circuit and can provide a way to affix the integrated circuit to a supporting structure such as a printed circuit board. One drawback of this approach is that the amount of space required to implement the combined printed circuit board and integrated circuit can be substantial.

Integrated circuits are most often formed, but are not limited to, a silicon-based substrate. Other substrates are possible and can offer different advantages. For example, gallium arsenide can be selected as a substrate and can offer faster circuit switching times yielding a faster overall design. In some designs, an integrated circuit can be thinned after the circuits themselves are formed on the substrate. Thinned integrated circuits can be produced by back-grinding the substrate to reduce an overall thickness. Thinned integrated circuits can require less volume in a design and can, in some designs, offer operational advantages. For example, a thinned integrated circuit can provide different transistor characteristics such as a lower channel resistance.

One way to take advantage of a thinned integrated circuit is to embed the circuit into a substrate such as a printed circuit board. Printed circuit boards (PCBs) can be relatively thick compared to the thinned integrated circuit. For example, a typical PCB can be 0.062 inches thick or thicker, while a thinned integrated circuit can be 50 microns thick. Problems may arise when the thinned integrated circuit is embedded into the PCB. For example, the thinned integrated circuit can suffer warpage or breakage as the PCB undergoes heating/cooling cycles. Furthermore, the thinned integrated circuit can have a different coefficient of thermal expansion than the PCB and can be subject to stresses as the PCB expands and contracts.

Therefore, what is desired is a way to affix a thinned integrated circuit within a PCB substrate that can reduce any extra stress that may be applied to the thinned integrated circuit.

SUMMARY OF THE DESCRIBED EMBODIMENTS

This paper describes various embodiments that relate to embedding a thinned integrated circuit within a substrate such as a printed circuit board. More particularly, a method and apparatus is described that positions the thinned integrated circuit toward a center (midplane) of the substrate.

In an exemplary embodiment, a method for forming a printed circuit assembly including a thinned integrated circuit can include the steps of receiving the thinned integrated circuit, attaching additional substrate layers to the thinned integrated circuit forming a thinned integrated circuit sub-assembly, affixing the thinned integrated circuit sub-assembly to a cavity within a printed circuit board (PCB) substrate, and coupling at least one additional PCB substrate layer to cover the thinned integrated circuit sub-assembly.

According to another exemplary embodiment, a method of forming an embeddable thinned integrated circuit sub-assembly can include the steps of receiving a thinned integrated circuit, attaching at least one additional substrate layer to the thinned integrated circuit to form at least a partial thinned integrated circuit sub-assembly, determining if the partial thinned integrated circuit sub-assembly is of sufficient thickness to align about mid-plane of a centerline within a printed circuit board (PCB) substrate, and attaching additional substrate layers to the at least one additional substrate layer based on the determining.

According to yet another exemplary embodiment, a printed circuit assembly can include a printed circuit board (PCB) substrate having a cavity defined therein, a thinned integrated circuit sub-assembly disposed in the cavity, and a PCB substrate layer covering the cavity. The thinned integrated circuit sub-assembly includes a thinned integrated circuit, an additional substrate layer fixedly attached to the thinned integrated circuit, and at least one via formed in the additional substrate layer for communication between the PCB substrate and the thinned integrated circuit.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Thinned integrated circuits can be relatively fragile and can be subject to fracture and failure, particularly when they are bent or flexed. In some embodiments, thinned integrated circuits can be embedded within a protective and operational substrate such as a printed circuit board. Although the printed circuit board can provide additional thickness and stability, the thinned integrated circuit can still be subjected to flexure and failure. For example, if the embedding substrate, although stiffer than the thinned integrated circuit, still provide substantial flexure, the thinned integrated circuit may be subject to at least a portion of this flexure. One way to limit flexure of the thinned integrated circuit is to embed the device relatively close to the mid-plane (centerline) of the embedding substrate. This orientation can help reduce stresses upon the thinned integrated circuit as the embedding substrate is subjected to motion.

Figure 1:
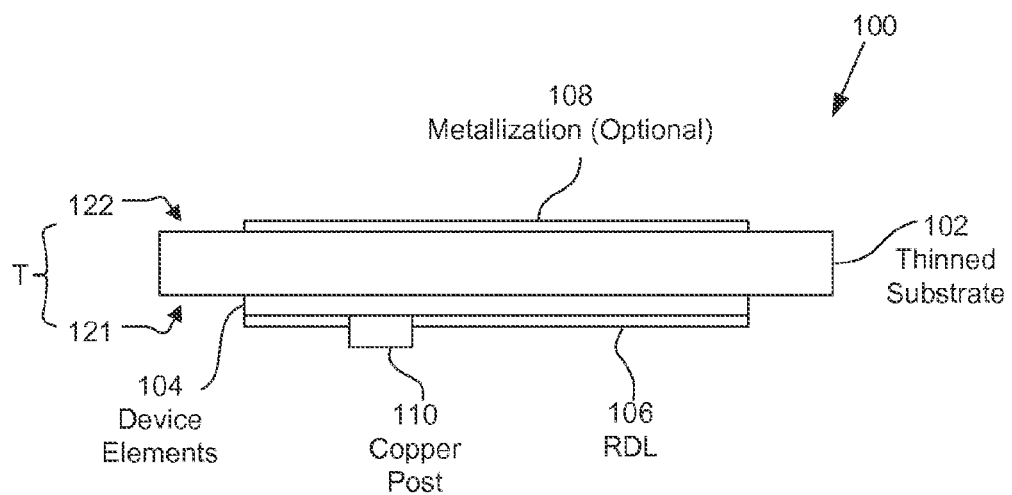
FIG. 1 is a block diagram of a thinned integrated circuit.

FIG. 1 is a block diagram of a thinned integrated circuit 100. The thinned integrated circuit can be formed on substrate 102. Substrate 102 can be silicon, gallium arsenide, sapphire or any other technically feasible material. Integrated circuit elements 104 such as transistors, gates, amplifiers, etc., can be formed on a first surface 121 of substrate 102. In some embodiments, a redistribution layer (RDL) 106 can be disposed on at least a portion of the integrated circuit elements 104 to allow contacts and connections for the integrated circuit elements 104 to be repositioned into more optimal locations for external connections such as bond wires and the like. In some embodiments, a metallization layer 108 can be disposed on substrate 102 and, more particularly, disposed on a second surface 122 opposite integrated circuit elements 104 and the first surface 121. In one embodiment, metallization layer 108 can be used to provide electromagnetic shielding for integrated circuit elements 104. In another embodiment, metallization layer 108 can affect integrated circuit element 104 characteristics such as circuit resistance. One or more copper posts 110 can be disposed/grown/formed onto one or more integrated circuit elements 104. Copper post 110 can be used to couple power and electrical signals to and from integrated circuit elements 104. For example, laser vias can couple to copper posts 110. In one embodiment, thinned integrated circuit 100 can have a thickness T between 50 and 80 microns.

Although the thinned integrated circuit 100 can possess many operational advantages, thinned integrated circuits can be relatively fragile, especially compared to traditional integrated circuit implementations. The fragile nature of thinned integrated circuits 100 can make them susceptible to damage from flexure. For example, if thinned integrated circuit 100 is simply embedded in a substrate such as a PCB, the thinned integrated circuit 100 may flex and crack as the PCB/thinned integrated circuit assembly undergoes handling or thermal cycling. Thermal cycling can affect the thinned integrated circuit 100 through, for example, different coefficients of thermal expansion between the PCB and the thinned integrated circuit 100. In one embodiment, damage can be minimized by controlling the orientation of the thinned integrated circuit 100 with respect to the supporting PCB.

Figure 2:
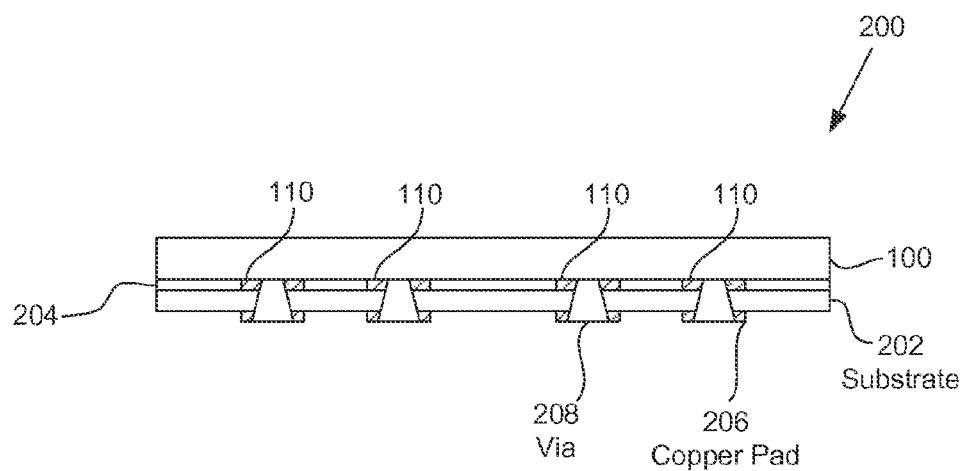
FIG. 2 is a block diagram of a thinned integrated circuit sub-assembly, in accordance with an exemplary embodiment.

FIG. 2 is a block diagram of a thinned integrated circuit sub-assembly 200, in accordance with an exemplary embodiment. Thinned integrated circuit sub-assembly 200 can include one or more portions of the thinned integrated circuit 100 described above. Thinned integrated circuit sub-assembly 200 can include elements that can assist in locating thinned integrated circuit 100 within an embedded PCB or other substrate and thereby reduce potential damage to thinned integrated circuit 100. As shown in FIG. 2, thinned integrated circuit 100 can include copper posts 110 as described above. One or more additional substrate layers 202 can be disposed onto a surface of thinned integrated circuit 100. In one embodiment, substrate layer 202 can be affixed to thinned integrated circuit 100 with a die attach film. In other embodiments, an adhesive or paste can be used to affix substrate layer 202 to thinned integrated circuit 100. Substrate layer 202 can be formed from any technically feasible material. In one embodiment, substrate layer 202 can be selected to have similar thermal characteristics as thinned integrated circuit 100. Substrate layers 202 can add controlled amounts of material that can bias the position of thinned integrated circuit sub-assembly 200 within a PCB. Additional layers 202 can be used to control the position of thinned integrated circuit 100 within supporting PCB. In one embodiment, thinned integrated circuit can be biased toward a midplane (centerline) of a supporting PCB.

One or more copper pads 206 can be disposed onto substrate layer 202. In one embodiment, copper pads 206 can be disposed adjacent to copper posts 110. A via 208 can penetrate both copper pad 206 and copper post 110 and thereby couple copper pad 206 to copper post 110. Electrical connections to integrated circuit elements 104 can be made by coupling to copper pad 206. In one embodiment via 208 can be a laser via. In another embodiment, via 208 can be formed from metallic bumps formed between layers. The metallic bumps can be copper, silver or any other technically feasible material.

Figure 3:
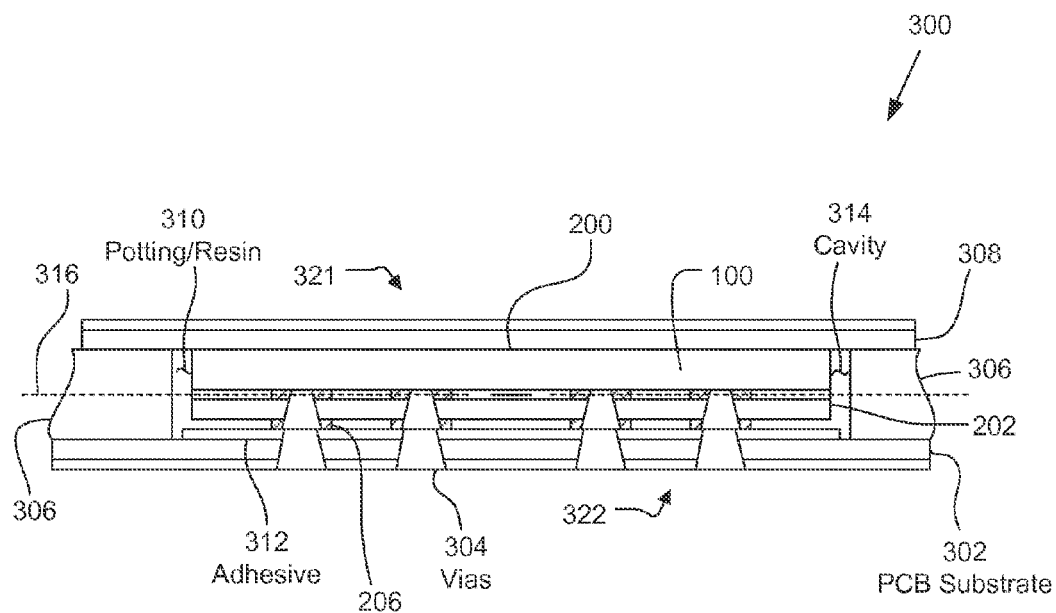
FIG. 3 is a block diagram of one exemplary embodiment of the thinned integrated circuit sub-assembly of FIG. 2, affixed within a printed circuit board.

FIG. 3 is a block diagram of an exemplary embodiment of the thinned integrated circuit sub-assembly 200, affixed within a PCB 300. Substrate layer 202 can bias and position thinned integrated circuit sub-assembly 200 toward a centerline 316 of PCB 300. The centerline 316 can be approximately midway between a top (321) and bottom (322) surface of PCB 300. Positioning thinned integrated circuit sub-assembly 200 near the centerline 316 can reduce flexure and help mitigate damage to the thinned integrated circuit 100.

Thinned integrated circuit sub-assembly 200 can be disposed into cavity 314 formed in PCB substrate 302. Cavity 314 can be a size and shape commensurate with thinned integrated circuit sub-assembly 200. In one embodiment, thinned integrated circuit sub-assembly 200 can be affixed to PCB substrate 302 with an adhesive layer 312. Adhesive layer 312 can be a die attach film, a pressure sensitive adhesive, an epoxy, or any other technically feasible adhesive. In one embodiment, PCB substrate material 306 can, at least in part, form cavity 314.

Potting resin or lamination fill 310 can be disposed into cavity 314 after thinned integrated circuit sub-assembly 200 is affixed to PCB 300. The potting resin or lamination fill 310 can fill voids and add rigidity and structure to PCB 300. One or more top layers 308 can be disposed onto PCB substrate material 306 and thinned integrated circuit sub-assembly 200. Vias 304, such as laser vias, can be disposed through PCB substrate 302 and couple to copper pads 206, and can couple power and signals to thinned integrated circuit sub-assembly 200.

Figure 4:
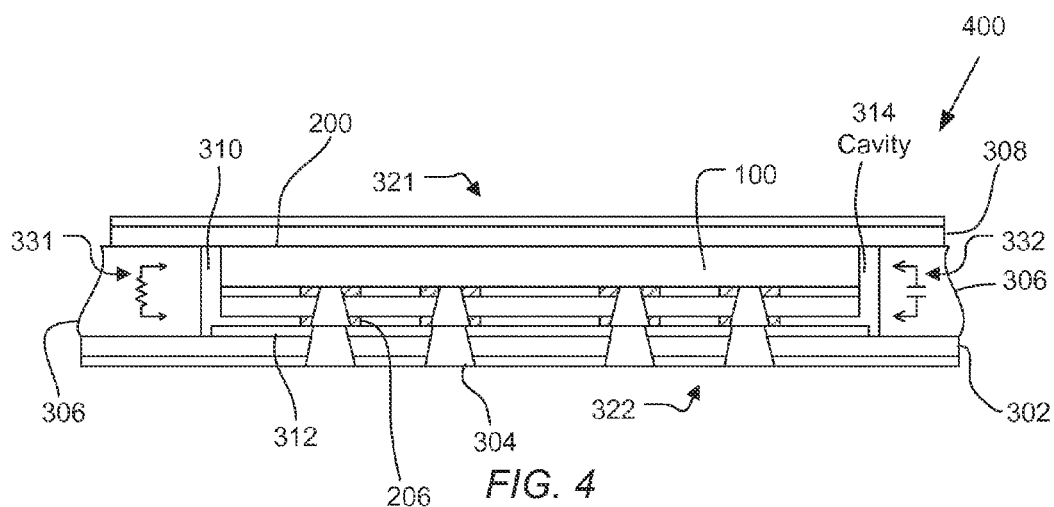
FIG. 4 is a block diagram of another exemplary embodiment of the thinned integrated circuit subs-assembly of FIG. 2, affixed within a printed circuit board.

FIG. 4 is a block diagram of another exemplary embodiment of the thinned integrated circuit sub-assembly 200, affixed within a PCB 400. Regions within PCB substrate material 306 can be used to support (embed) one or more components that can be coupled to thinned integrated circuit substrate 200. In some embodiments, components such as passive components can be embedded in PCB substrate material 306 and can be coupled to thinned integrated circuit sub-assembly 200. Examples of passive components can be resistors (331), capacitors (332), inductors (not illustrated for clarity) and the like. By embedding components in PCB substrate material 306, fewer external components may be required to be affixed on an outer surface of PCB substrate 302. In one embodiment, passive components can be coupled to thinned integrated circuit sub-assembly 200 with copper traces supported within PCB substrate 302. In other embodiments, active components including transistors and other integrated circuits can be embedded with PCB substrate material 306 and can couple to thinned integrated circuit sub-assembly 200.

Figure 5:
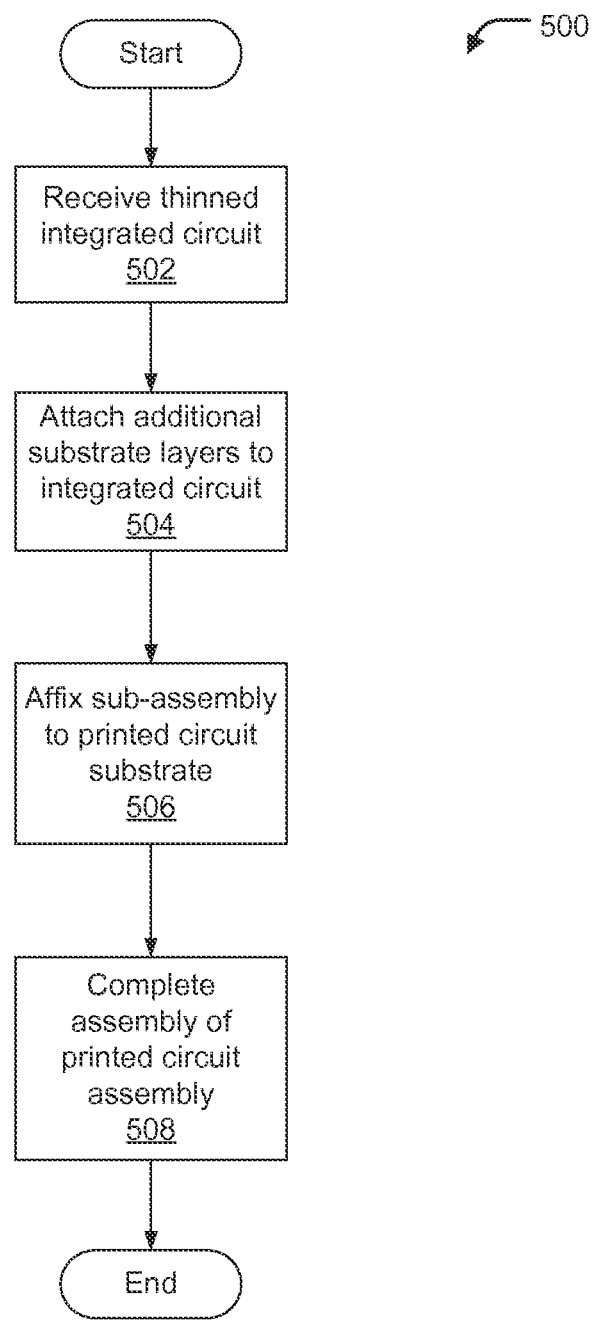
FIG. 5 is a flow chart of a method of forming a printed circuit assembly including an embedded thinned integrated circuit, according to an exemplary embodiment.

FIG. 5 is a flow chart of a method of forming a printed circuit assembly (PCA) including thinned integrated circuit sub-assembly 200 in accordance with one embodiment described in the specification. The method can begin in step 502 when a thinned integrated circuit 100 is received. In step 504, one or more additional substrate layers 202 can be attached to thinned integrated circuit 100. In some embodiments, additional copper pads 206 and vias 208 can also be included with additional substrate layers 202. The additional substrate layers 202 can help position the newly formed thinned integrated circuit sub-assembly within a printed circuit board. In one embodiment, the substrate layers 202 can position thinned integrated circuit sub-assembly toward the centerline or mid-plane of the PCA. In step 506, the thinned integrated circuit sub-assembly 200 can be affixed to a PCB substrate 302. The thinned integrated circuit sub-assembly 200 can be affixed with die attach film, epoxy or any other technically feasible adhesive. In step 508, assembly of PCA can be completed. For example, potting resin 310 can be added to cavity 314 and additional PCB substrate layers 308 can be disposed to PCB substrate 302 and the method can end.

Figure 6:
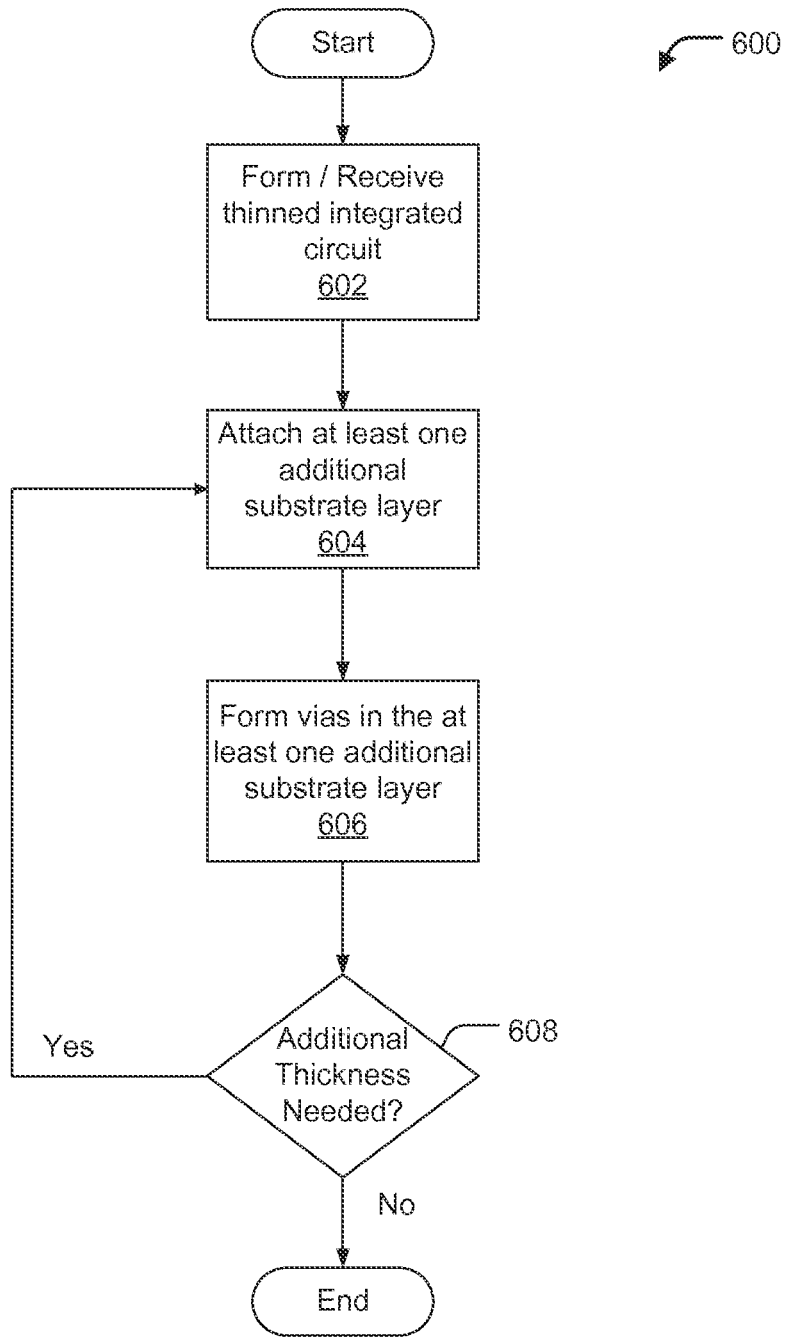
FIG. 6 is a flow chart of a method of forming an embeddable thinned integrated circuit sub-assembly with one or more additional substrate layers for mid-plane alignment, according to an exemplary embodiment.

Regarding alignment and positioning of the integrated circuit sub-assembly within the printed circuit board, more or less layers than those particularly illustrated may be formed for proper placement. For example, turning to FIG. 6, a flow chart of a method of forming an embeddable thinned integrated circuit sub-assembly with one or more additional substrate layers for mid-plane alignment is illustrated. The method 600 can begin by forming or receiving a thinned integrated circuit 100 at step 602. In step 604, at least one additional substrate layer 202 is attached to the thinned integrated circuit 100 to form at least a partial integrated circuit sub-assembly 200. Thereafter, vias may be formed in the at least one additional substrate 202 at step 606. If additional thickness is needed for proper placement, alignment, and/or positioning of the created sub-assembly is determined in step 608, additional substrate layers 202 may be iteratively formed through steps 604-606. Thereafter, the method may end or the created integrated circuit sub-assembly may be embedded within a PCB as described with reference to FIGS. 2-5.

The various aspects, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for forming a printed circuit assembly including a thinned integrated circuit, the method comprising:
    attaching additional substrate layers to the thinned integrated circuit forming a thinned integrated circuit sub-assembly, the thinned integrated circuit comprising a metallization layer;
    affixing the thinned integrated circuit sub-assembly to a cavity within a printed circuit board (PCB) substrate such that the thinned integrated circuit sub-assembly is aligned about mid-plane to a centerline of the PCB substrate;
    coupling at least one additional PCB substrate layer to cover the thinned integrated circuit sub-assembly; and
    forming at least one laser via through the additional substrate layers and the PCB substrate to the thinned integrated circuit.

2. The method of claim 1, wherein the thinned integrated circuit is between about 50 and 80 microns in thickness.

3. The method of claim 1, wherein attaching additional substrate layers to the thinned integrated circuit comprises:
    attaching at least one additional substrate layer to the thinned integrated circuit with a die attach film or an adhesive.

4. The method of claim 1, wherein the additional substrate layers are formed of a material with similar thermal characteristics as the thinned integrated circuit.

5. The method of claim 1, wherein affixing the thinned integrated circuit sub-assembly to the cavity comprises:
    applying an adhesive layer to an interior surface of the cavity; and
    affixing the thinned integrated circuit sub-assembly to the adhesive layer.

6. The method of claim 5, further comprising filling voids in the cavity about the affixed thinned integrated circuit sub-assembly.

7. A method of forming an embeddable thinned integrated circuit sub-assembly within a printed circuit board (PCB) substrate having a PCB thickness, comprising:
   attaching a substrate layer to a thinned integrated circuit comprising a metallization layer to form at least a partial thinned integrated circuit sub-assembly;
   determining if the partial thinned integrated circuit sub-assembly has a thickness sufficient for the partial thinned integrated circuit sub-assembly to align about a mid-plane of a centerline within the printed circuit board (PCB) substrate; and
   attaching additional substrate layers to the substrate layer until the thickness of the partial thinned integrated circuit sub-assembly is sufficient for the partial thinned integrated sub-assembly to align about the mid-plane in accordance with the determining; and
   forming at least one laser via through the at least one additional substrate layer to the thinned integrated circuit.

8. The method of claim 7, wherein the thinned integrated circuit is between about 50 and 80 microns in thickness.

9. The method of claim 7, wherein attaching the at least one additional substrate layer to the thinned integrated circuit comprises:
   attaching the at least one additional substrate layer to the thinned integrated circuit with a die attach film or an adhesive.

10. The method of claim 9, wherein attaching additional substrate layers to the at least one additional substrate layer comprises:
    iteratively attaching the additional substrate layers to attached additional substrate layers with a die attach film or an adhesive.

11. The method of claim 7, wherein the additional substrate layers are formed of a material with similar thermal characteristics as the thinned integrated circuit.

12. A printed circuit assembly, comprising:
    a printed circuit board (PCB) substrate having a cavity defined therein;
    a thinned integrated circuit sub-assembly disposed in the cavity in accordance with a mid-plane alignment with a centerline of the PCB substrate and comprising a metallization layer; and
    a PCB substrate layer covering the cavity;
    wherein the thinned integrated circuit sub-assembly comprises:
    a thinned integrated circuit;
    an additional substrate layer fixedly attached to the thinned integrated circuit; and
    at least one laser via formed through the additional substrate layer for communication between the PCB substrate and the thinned integrated circuit.

13. The printed circuit assembly of claim 12, further comprising:
    a filler material disposed in the cavity about the thinned integrated circuit sub-assembly configured to fill voids within the cavity; and
    an adhesive layer fixedly attaching the thinned integrated circuit sub-assembly to an interior surface of the cavity.

14. The printed circuit assembly of claim 12, wherein the thinned integrated circuit sub-assembly is disposed in mid-plane alignment with a centerline of the PCB substrate.

* * * * *